United States Patent
Hoogeveen

(10) Patent No.: US 7,602,186 B2
(45) Date of Patent: Oct. 13, 2009

(54) RF COIL SYSTEM FOR AN MRI SYSTEM WITH A FIXED COIL AND WITH A MOVING COIL PART BELOW THE PATIENT SUPPORT

(75) Inventor: Romhild Martijn Hoogeveen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 311 days.

(21) Appl. No.: 10/597,763

(22) PCT Filed: Feb. 3, 2005

(86) PCT No.: PCT/IB2005/050447

§ 371 (c)(1),
(2), (4) Date: Aug. 7, 2006

(87) PCT Pub. No.: WO2005/076027

PCT Pub. Date: Aug. 18, 2005

(65) Prior Publication Data

US 2008/0150535 A1   Jun. 26, 2008

(30) Foreign Application Priority Data

Feb. 9, 2004  (EP) .................................. 04100475

(51) Int. Cl.
*G01V 3/00* (2006.01)
(52) U.S. Cl. .................. 324/318; 324/307; 324/309
(58) Field of Classification Search ......... 324/300–322; 600/407–423
See application file for complete search history.

(56) References Cited

U.S. PATENT DOCUMENTS

| | | | |
|---|---|---|---|
| 3,471,774 A * | 10/1969 | Muschinske et al. | 324/306 |
| 4,882,560 A | 11/1989 | Young et al. | |
| 5,197,474 A * | 3/1993 | Englund et al. | 600/415 |
| 5,431,164 A * | 7/1995 | Westphal et al. | 324/307 |
| 5,502,387 A | 3/1996 | McGill | |
| 5,600,245 A | 2/1997 | Yamamoto et al. | |
| 5,928,148 A * | 7/1999 | Wang et al. | 600/420 |
| 6,529,004 B1 * | 3/2003 | Young | 324/318 |
| 6,825,665 B2 * | 11/2004 | Eberler et al. | 324/318 |
| 6,946,836 B2 * | 9/2005 | Kuhara | 324/307 |
| 7,009,396 B2 * | 3/2006 | Zhu et al. | 324/309 |
| 7,218,106 B2 * | 5/2007 | Yasuhara et al. | 324/307 |

(Continued)

FOREIGN PATENT DOCUMENTS

JP  2002-10992 A  1/2002

OTHER PUBLICATIONS

Bydder, M., et al.; Generalized SMASH Imaging; 2002; MRM; 47:160-170.

*Primary Examiner*—Brij B. Shrivastav
*Assistant Examiner*—Tiffany A Fetzner

(57) ABSTRACT

The present invention relates to an RF system for a magnetic resonance imaging device (13). The RF system comprises an RF transmitter coil subsystem and an RF receiver coil subsystem (18), wherein the RF receiver coil subsystem comprises at least one first coil-like element (19) and at least one second coil-like element (20), wherein the or each first coil-like element is assigned to a main magnet system (15) of the magnetic resonance imaging device, and wherein the or each second coil-like element is assigned to an object (14) to be analyzed by the magnetic resonance imaging device.

9 Claims, 3 Drawing Sheets

U.S. PATENT DOCUMENTS

Figure 1:
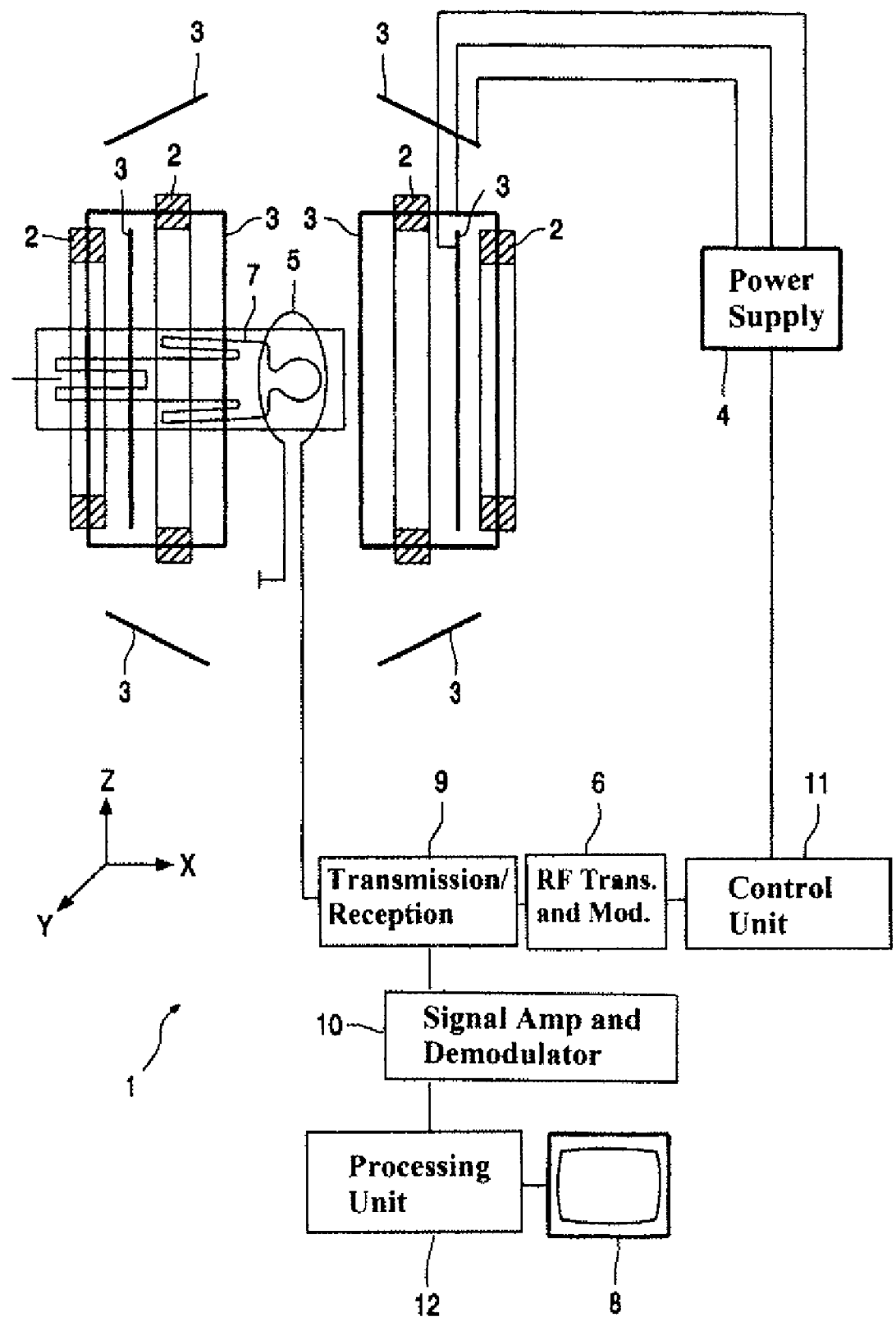

| | | |
|---|---|---|
| 2002/0021128 A1 | 2/2002 | Kuhara |
| 2002/0138001 A1 | 9/2002 | Kroeckel |
| 2002/0140423 A1 | 10/2002 | Brittain |
| 2002/0180441 A1 | 12/2002 | Schaaf |
| 2004/0021467 A1* | 2/2004 | Eberler et al. ............... 324/318 |
| 2004/0167803 A1 | 8/2004 | Ma et al. |
| 2005/0122108 A1* | 6/2005 | Yasuhara et al. ............ 324/318 |

* cited by examiner

RF COIL SYSTEM FOR AN MRI SYSTEM WITH A FIXED COIL AND WITH A MOVING COIL PART BELOW THE PATIENT SUPPORT

The present invention relates to an RF system for a magnetic resonance imaging device, comprising an RF transmitter coil subsystem and an RF receiver coil subsystem.

The present invention also relates to a magnetic resonance imaging device, comprising a main magnet system, a gradient coil system, an RF system and a signal processing system, said RF system comprising an RF transmitter coil subsystem and an RF receiver coil subsystem.

The basic components of a magnetic resonance imaging (MRI) device are the main magnet system, the gradient coil system, the RF system and the signal processing system. The main magnet system typically comprises a bore hole enabling the entry of an object to be analyzed by the MRI device, and generates a strong uniform static field for polarization of nuclear spins in the object to be analyzed. The gradient coil system is designed to produce time-varying magnetic fields of controlled spatial non-uniformity. The RF system mainly consists of an RF transmitter coil subsystem and an RF receiver coil subsystem, wherein the RF transmitter coil subsystem is capable of generating a rotating magnetic field for excitation of nuclear spin resonance in the object to be analyzed, and wherein the RF receiver coil subsystem converts a precessing magnetization of spinning nuclei into electrical signals. The signal processing system generates images on the basis of the electrical signals. The present invention is related to the RF system of such an MRI device, especially to the RF receiver coil subsystem of such an RF system.

It should be noted that MRI devices which comprise the above-mentioned bore hole within the main magnet system are also often called cylindrical (or closed) MRI devices. The present invention is not limited to such cylindrical MRI devices. The invention can also be used in non-cylindrical (or open) MRI devices typically comprising a C-arm with a cavity instead of the bore hole.

From prior art two types of RF systems or RF receiver coil subsystems are known. According to a first type of such an RF system, the entire RF receiver coil subsystem is fixed to the object to be analyzed, preferably around said object. Such RF systems have the disadvantage that there are many cables and moving parts that may interfere with a comfortable position of the object to be analyzed. Such an RF system may also hamper the preparation of the object to be analyzed, because a lot of coils have to be placed around said object. Within the second type of RF systems or RF receiver coil systems, the entire RF receiver coil system is fixed to the main magnet system of the magnetic resonance imaging device. This type of RF systems have the disadvantage that the RF receiver coil subsystem is positioned with a larger distance from the object to be analyzed, resulting in a lower signal-to-noise ratio. Reference is made to the prior art U.S. Pat. No. 5,600,245 and US 2002/0138001 A1.

It is an object of the invention to provide an RF system of the kind mentioned in the opening paragraph and a magnetic resonance imaging device of the kind mentioned in the opening paragraph, in which the disadvantages of the known RF system and of the known magnetic resonance imaging device are prevented as much as possible.

In order to achieve said object, an RF system in accordance with the invention is characterized in that the RF receiver coil subsystem comprises at least one first coil element and at least one second coil element, wherein the or each first coil element is assigned to a main magnet system of the magnetic resonance imaging device, and wherein the or each second coil element is assigned to an object to be analyzed by the magnetic resonance imaging device.

In order to achieve said object, a magnetic resonance imaging device in accordance with the invention is characterized in that the RF receiver coil subsystem comprises at least one first coil element and at least one second coil element, wherein the or each first coil element is assigned to the main magnet system, and wherein the or each second coil element is assigned to an object to be analyzed by the magnetic resonance imaging device.

An RF system in accordance with the invention and a magnetic resonance imaging device comprising such an RF system have various advantages over the MRI devices and RF systems known from prior art. Compared to an RF system for which all coils are attached to the object to be analyzed and for which all coils move with the object to be analyzed, there are advantages for the operator of the magnetic resonance imaging device and for the object to be analyzed. For the operator it is much easier to set up the object to be analyzed because of the fact that only the second coil element has to be attached to the object and that fewer cables have to be connected to the MRI device. For the object to be analyzed, the comfort can be increased because of the fact that there are no coils positioned between the bed and the posterior part of the object. In addition, there is more space available in the examination space. Compared to a device where all parts of the RF receiver coil subsystem are fixed to the main magnet system, a higher signal-to-noise ratio can be achieved, because of the fact that the parts of the RF receiver coil subsystem are positioned closer to the object to be analyzed.

In accordance with a preferred embodiment of the invention, the or each first coil element is positioned below, preferably directly below, a support or bed on which the object to be analyzed is placed. The or each first coil element is attached to the main magnet system of the magnetic resonance imaging device, in a way that a relative movement between said support or bed and the or each first coil element is possible.

In accordance with a further improved, preferred embodiment of the invention, the or each second coil element is positioned above, preferably directly above, the object to be analyzed. The or each second coil element is attached to the object to be analyzed, in a way that the or each second coil element is movable together with the object to be analyzed. The or each second coil element is movable together with a support or bed on which the object to be analyzed is placed relative to the or each first coil element.

Figure 2:
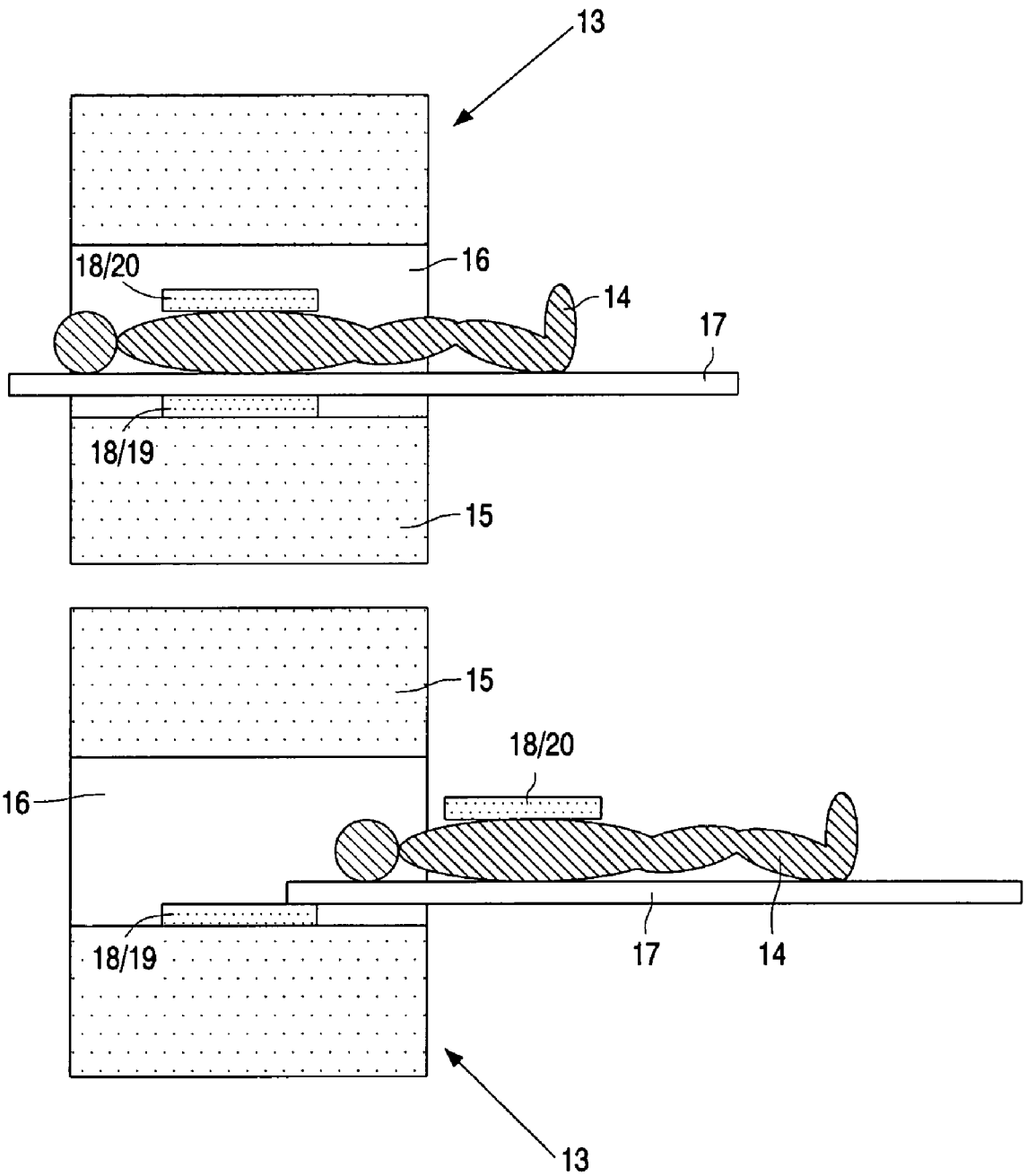
Figure 3:
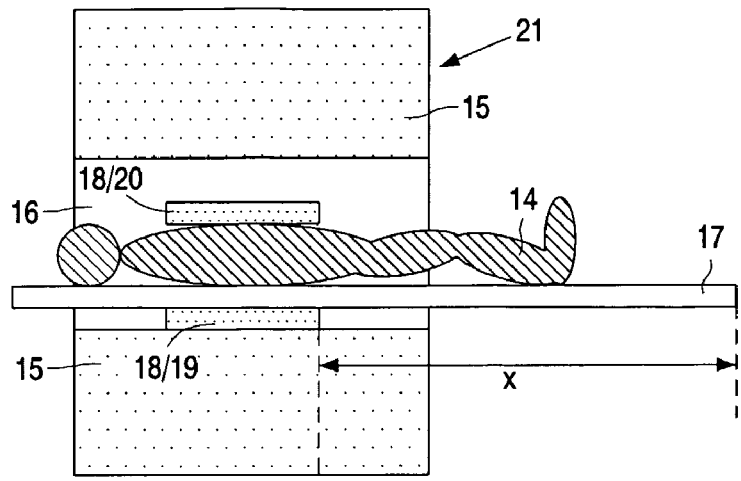
Figure 3:
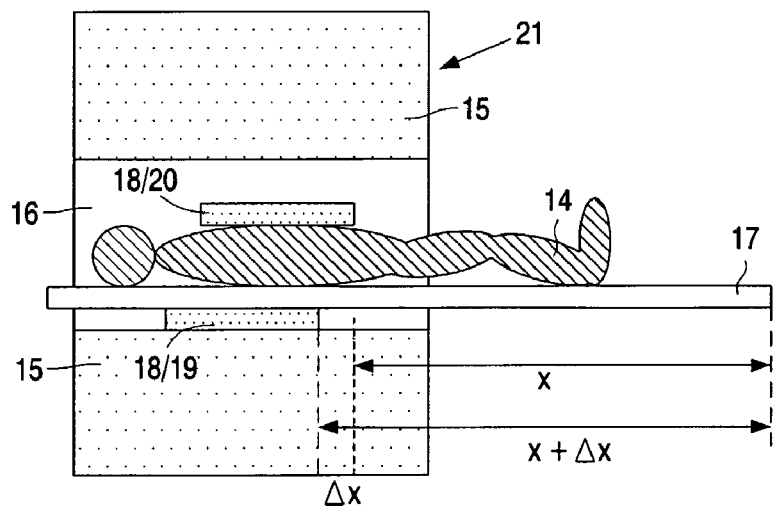
Figure 3:
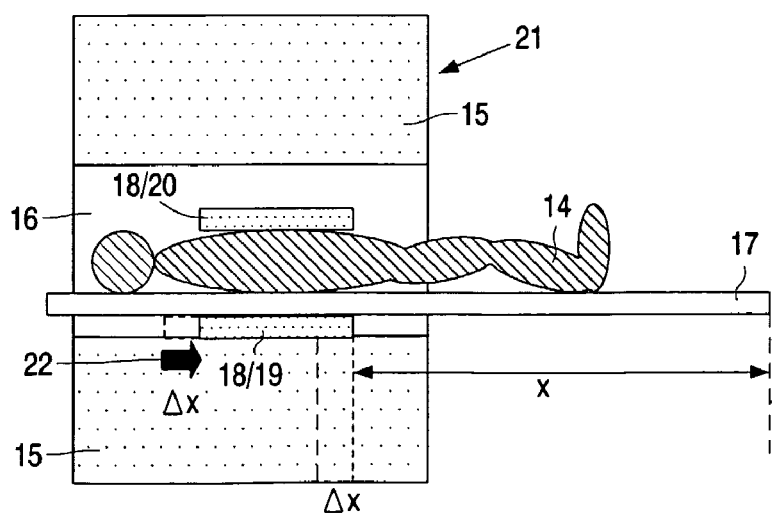

Embodiments of an RF system and a magnetic resonance imaging device in accordance with the invention will be described in the following with reference to the Figs., wherein FIG. 1 shows an MRI device according to the prior art;

FIG. 2 shows an MRI device including an RF system, namely an RF receiver coil subsystem, according to a first embodiment of the present invention; and FIG. 3 shows an MRI device including an RF system, namely an RF receiver coil subsystem, according to a second embodiment of the present invention.

FIG. 1 shows a magnetic resonance imaging (MRI) device 1 known from prior art which includes a main magnet system 2 for generating a steady magnetic field, and also several gradient coils providing a gradient coil system 3 for generating additional magnetic fields having a gradient in the X, Y, Z directions. The X direction of the coordinate system shown corresponds to the direction of the steady magnetic field in the main magnet system 2 by convention. The X axis is an axis co-axial with the axis of an examination space of the main magnet system 2, the Z axis is the vertical axis extending from the center of the magnetic filed, and the Y axis is the corresponding horizontal axis orthogonal to the X axis and the Z axis. The gradient coils of the gradient coil system 3 are fed by a power supply unit 4.

The magnetic resonance imaging (MRI) device 1 according to FIG. 1 further includes an RF system 5 comprising an RF transmitter coil subsystem and an RF receiver coil subsystem. The RF transmitter coil subsystem serves to generate RF magnetic fields and is connected to an RF transmitter and modulator 6. The RF receiver coil subsystem is used to receive the magnetic resonance signal generated by the RF field in the object 7 to be examined, for example a human or animal body.

Furthermore, the main magnet system 2 encloses an examination space which is large enough to accommodate a part of the body 7 to be examined. The RF system 5, namely the RF receiver coil subsystem, is connected to a signal amplifier and demodulation unit 10 via a transmission/reception circuit 9.

The control unit 11 controls the RF transmitter and modulator 6 and the power supply unit 4 so as to generate special pulse sequences which contain RF pulses and gradients. The phase and amplitude obtained from the demodulation unit 10 are applied to a processing unit 12. The processing unit 12 processes the presented signal values so as to form an image by transformation. This image can be visualized, for example by means of a monitor 8.

According to the present invention, the magnetic resonance imaging (MRI) device 1 comprises an improved RF system, namely an improved RF receiver coil subsystem, which will be described below in greater detail. The present invention provides a new RF system for magnetic resonance imaging devices.

FIG. 2 shows a magnetic resonance imaging device 13 together with an object 14 to be analyzed in two different positions of said object 14. FIG. 2 shows a main magnet system 15 of the magnetic resonance imaging device 13 enclosing an examination space 16, said examination space 16 being large enough to accommodate at least a part of the object 14 to be analyzed. The object 14 to be analyzed is positioned on a support or bed 17, which support or bed 17 can be moved relative to the main magnet system 15, so that the object 14 to be analyzed can be inserted into the examination space 16 or removed from said examination space 16. In the upper part of FIG. 1, the object 14 to be analyzed is nearly completely inserted in the examination space 16. In the lower part of FIG. 1, the object 14 to be analyzed is nearly completely removed from the examination space 16.

In addition to the main magnet system 15 enclosing said examination space 16, the magnetic resonance imaging device 13 according to the present invention comprises also a gradient coil system and an RF system. In order to simplify the drawing of FIG. 2, the gradient coil system is not shown in FIG. 2. In addition, only the RF receiver coil subsystem 18 of the RF system is shown in FIG. 2.

The RF receiver coil subsystem 18 according to the present invention comprises at least one first coil element 19 and at least one second coil element 20. The or each first coil element 19 is assigned to the main magnet system 15 of the magnetic resonance imaging device 13. The or each first coil element 19 may be designed as part of a built-in system body coil. The or each second coil element 20 is assigned to the object 14 to be analyzed by the magnetic resonance imaging device 13. FIG. 2 shows only one first coil element 19 and one second coil like element 20. Each of these coil elements may comprise one or more loops.

According to the embodiment of FIG. 2, the first coil element 19 of the RF receiver coil subsystem 18 is attached to the main magnet system 15 and positioned directly below the support or bed 17 on which the object to be analyzed is placed. The first coil element 19 of the RF receiver coil subsystem 18 is, according to the embodiment of FIG. 2, fixedly attached to the main magnet system 15. This allows a movement of the support or bed 17 relative to the main magnet system 15 and relative to the first coil element 19.

The second coil element 20 of the RF receiver coil subsystem 18 is attached to the object 14 to be analyzed, namely directly above the object 14. The second coil element 20 is movable together with the support or bed 17, and therefore together with the object 14 to be analyzed, relative to the main magnet system 15 and relative to the first coil element 18.

Within the embodiment shown in FIG. 2, the RF receiver coil subsystem 18 is designed as a multi-element coil, a first coil element 19 being fixed to the main magnet system 15, and a second coil element 20 being fixed to the object 14. The first coil element 19, which is fixed to the main magnet system 15, is placed directly below the support or bed 17, close to the posterior part of the object 14. The second coil element 20, which is fixed to the object 14, is placed on top of the object 14, namely directly on the anterior part of the object 14. Therefore, the first coil element 19 and the second coil element 20 acting together as a receiver coil are positioned close to the object 14 to be analyzed.

FIG. 3 shows a second embodiment of a magnetic resonance imaging device comprising a RF system, namely a RF receiver coil subsystem, according to the present invention. The embodiment according to FIG. 3 comprises similar components as the embodiment of FIG. 2. For that reason, in order to avoid unnecessary repetitions, the same reference numerals are used.

The embodiment of FIG. 3 differs from the embodiment of FIG. 2 only with respect to the feature that the first coil element 19 of the RF receiver coil subsystem 18 is not fixedly attached to the main magnet system 15, but movably attached thereto. As a result, the support or bed 17 can be moved relative to the first coil element 19, and in addition, the first coil element 19 can be moved relative to the support or bed 17 on which the object 14 to be analyzed is positioned and relative to the main magnet system 15. Such a configuration can be used to optimize image quality.

In the upper part of FIG. 3 pre-scans of the object 14 to be analyzed are obtained at a certain position x of the support or bed 17. In order to optimize image quality, the bed 17 is moved slightly to the position x+Δx as shown in the middle part of FIG. 3. When the bed 17 is moved to the position x+Δx, the second coil element 20 of the RF receiver coil subsystem 18 attached to the object 14 on the anterior part of the object 14 moves by the distance Δx It should be noted that the distance Δx is only a small distance. In case that the image quality at the position x+Δx is better compared to the image quality at the position x of the bed 17, the first coil element 19 of the RF receiver coil-subsystem 18 can be moved slightly by the distance Δx as shown by the arrow 22 in the lower part of FIG. 3. By moving the first coil element 19 by the distance Δx, the pre-scans are also valid for the bed 17 at the position x+Δx.

Compared to a RF system for which all coils are attached to the object to be analyzed and for which all coils move with the object 14 to be analyzed, there are advantages for the operator of the magnetic resonance imaging device 21 and for the object to be analyzed. For the operator it is much easier to set up the object to be analyzed because of the fact that only the second coil element 20 has to be attached to the object 14 and that fewer cables have to be connected to the MRI device 21. For the object 14 to be analyzed, the comfort can be increased because of the fact that there are no coils positioned between the bed 17 and the posterior part of the object 14. In addition, there is more space available in the examination space 16. Compared to a device where all parts of the RF receiver coil subsystem are fixed to the main magnet system, a higher signal-to-noise ratio can be achieved, because of the fact that the parts of the RF receiver coil subsystem are positioned closer to the object to be analyzed.

In both embodiments shown in FIGS. 2 and 3, the second coil element 20, which is assigned to the object 14 to be analyzed, can be designed as a wearable unit. Said wearable unit is attachable to the object 14 to be analyzed, outside the magnetic resonance imaging device and before MRI analysis. So, the object 14 can put on such a wearable unit before the examination starts.

Furthermore, the bed 17 can be designed in a way that the bed 17 is compatible with a trolley system. This would allow to prepare the object to be analyzed on such a trolley outside an examination room, including the placement of the second coil element 20. It is then possible to transport the object 14 to be analyzed to the MRI device already prepared for examination.

The invention claimed is:

1. An RF system configured for a magnetic resonance imaging device comprising:
    a main magnet system configured to define an imaging bore;
    a support configured to support and move a subject longitudinally into and along the bore;
    a gradient coil system configured to create magnetic field gradients in the imaging bore;
    an RF transmitter coil subsystem configured to transmit RF pulses into the imaging bore;
    an RF receiver coil subsystem including:
        a first RF coil structure that is positioned in the bore entirely below the plane of the support and is longitudinally movably mounted to the main magnet system, the support being longitudinally movable independently of the first RF coil structure and the first RF coil structure being configured to move longitudinally independently of the support and to move longitudinally independent of the main magnet system; and,
        a second RF coil structure configured to be attached to and above the subject being analyzed such that the second RF coil structure moves together with the subject, independent of the first RF coil structure.

2. An RF system configured for a magnetic resonance imaging device, comprising:
    an RF transmitter coil subsystem and
    an RF receiver coil subsystem, the RF receiver coil subsystem including:
    at least one first coil element and at least one second coil element, the at least one first coil element being longitudinally movably attached to the main magnet system separate from a support or bed on which an object to be analyzed is placed, such that the object and the support or bed move together longitudinally relative to the at least one first coil element and that the at least one first coil element moves longitudinally relative to the main magnet system independently of the support or bed and is positioned below, and entirely underneath the plane of the support or bed and the at least one second coil element being connected to an object to be analyzed by the magnetic resonance imaging device.

3. The RF system according to claim 2, wherein the at least one first coil element is designed as part of a built-in system body coil.

4. The RF system according to claim 2, wherein the at least one first coil element is attached to the main magnet system of the magnetic resonance imaging device, in a way that in the bore the support or bed is longitudinally movable relative to the at least one first coil element.

5. The RF system according to claim 2, wherein the at least one second coil element is positioned above the object to be analyzed by the magnetic resonance imaging device.

6. The RF system according to claim 5, wherein the at least one second coil element is attached to the object to be analyzed, in a way that the at least one second coil element is movable together with the object to be analyzed.

7. The RF system according to claim 6, wherein the at least one second coil element is longitudinally movable together with the support or bed on which the object to be analyzed is placed longitudinally relative to the at least one first coil element.

8. The RF system according to claim 5, wherein the at least one second coil element is designed as a wearable unit, wherein said wearable unit is attachable to the object to be analyzed, outside the magnetic resonance imaging device and before MRI analysis.

9. A magnetic resonance imaging device, comprising:
    a main magnet systems;
    a support or bed which supports an object that is to be analyzed;
    a gradient coil system;
    an RF system and a signal processing system, said RF system comprising an RF transmitter coil subsystem; and
    an RF receiver coil subsystem,
        wherein the RF receiver coil subsystem comprises:
            at least one first coil element; and
            at least one second coil element;
                wherein the at least one first coil element is longitudinally movably attached to the main magnet system and is separate from and entirely below the plane of the bed or support, in a way that the support or bed is longitudinally movable independently of the at least one first coil element and that the at least one first coil element is longitudinally movable independently of the bed or support and longitudinally movable independently of the main magnet system, and
                wherein the at least one second coil element is attached to an object to be analyzed by the magnetic resonance imaging device and moves with the object.

* * * * *